(12) United States Patent
Schuermann et al.

(10) Patent No.: US 7,329,876 B2
(45) Date of Patent: Feb. 12, 2008

(54) NARROW-BAND TRANSMISSION FILTER FOR EUV RADIATION

(75) Inventors: Max Christian Schuermann, Luebbecke (DE); Thomas Missalla, Jena (DE)

(73) Assignee: XTREME Technologies GmbH, Jena (DE)

( * ) Notice: Subject to any disclaimer, the term of this patent is extended or adjusted under 35 U.S.C. 154(b) by 0 days.

(21) Appl. No.: 11/623,628

(22) Filed: Jan. 16, 2007

(65) Prior Publication Data

US 2007/0170367 A1    Jul. 26, 2007

(30) Foreign Application Priority Data

Jan. 26, 2006    (DE) .................. 10 2006 004 155

(51) Int. Cl.
*G21K 3/00*    (2006.01)
(52) U.S. Cl. .................. 250/372; 378/84; 378/156
(58) Field of Classification Search .......... 250/372; 378/34, 84, 85, 145, 156, 161
See application file for complete search history.

(56) References Cited

U.S. PATENT DOCUMENTS

| | | | |
|---|---|---|---|
| 3,982,125 A * | 9/1976 | Roder | 378/86 |
| 4,039,838 A | 8/1977 | DiPiazza | |
| 5,485,499 A * | 1/1996 | Pew et al. | 378/84 |
| 6,594,334 B1 | 7/2003 | Ota | |
| 6,710,351 B2 | 3/2004 | Berger | |
| 6,781,135 B2 | 8/2004 | Berger | |

FOREIGN PATENT DOCUMENTS

| | | |
|---|---|---|
| EP | 1 530 222 | 5/2005 |
| WO | WO 03/017005 | 2/2003 |

OTHER PUBLICATIONS

Richard Lunt Sandberg, Optical applications of uranium thin-film compounds for the extreme ultraviolet and soft X-ray region, Aug. 2004, pp. 47.

* cited by examiner

*Primary Examiner*—David Porta
*Assistant Examiner*—Mark R Gaworecki
(74) *Attorney, Agent, or Firm*—Reed Smith LLP

(57) ABSTRACT

The object of the invention is to provide a transmission filter for EUV radiation which has a sufficiently narrow transmission window to characterize EUV radiation in a narrowly defined spectral region. This object is met by providing a transmission layer system having at least one uranium-containing layer.

15 Claims, 5 Drawing Sheets a b a b a b

NARROW-BAND TRANSMISSION FILTER FOR EUV RADIATION

CROSS-REFERENCE TO RELATED APPLICATION

This application claims priority of German Application No. 10 2006 004 155.0, filed Jan. 26, 2006, the complete disclosure of which is hereby incorporated by reference.

BACKGROUND OF THE INVENTION a) Field of the Invention

Techniques for characterizing EUV radiation and beam profiles are needed in EUV lithography. These techniques pertain to the characterization of EUV sources directly as well as to the characterization of downstream beam delivery systems such as collector optics, illumination optics, imaging optics and masks. On the one hand, these components must be characterized with a view to meeting specifications; on the other hand, corresponding measurement methods are needed for process control within the total system. In this connection, the behavior of these components in the EUV in-band region of 13.5 nm is of particular interest. The present invention relates, in particular, to a narrow-band transmission filter for EUV radiation.

b) Descrption of the Related Art

Plasma lamps which emit in a broad spectral band from the soft x-ray range to thermal infrared are provided for generating the EUV radiation required for lithography. Therefore, one of the chief tasks of a method for measuring EUV radiation consists in the spectral filtering of the proportion of EUV in-band radiation which is in the range of several percent.

The use of reflection gratings and transmission gratings in monochromators and spectrographs in a known manner for spectral filtering (monochromatization) of EUV radiation requires well-defined beam paths which are usually given by entrance slits and exit slits. Not only does this lead to a relatively complex construction of high mechanical precision but also, due to the usually small effective grating surface, only a small solid angle of radiation can be detected. The latter is disadvantageous in extensively isotropic radiation sources such as plasma lamps because, for one, the flow of radiation to the detector is small and, for another, a measuring system based on gratings must be oriented precisely to the radiation source.

The reflectivity of multilayer mirrors with a corresponding layer design can present a pronounced narrow-band maximum at 13.5 nm. Therefore, they are extremely well suited for spectral filtering of EUV in-band radiation. Measurement arrangements based on this concept are described in the publication WO 03/017005 A1. However, the position and shape of the maximum of the reflectivity of multilayer mirrors depend not only on the layer design but also on the incident angle of the radiation. Consequently, the incident angle of the radiation must lie within determined tolerances in order to avoid an excessive change in the reflectivity as a function of wavelength. In practice, diaphragms are used for isotropic EUV sources in order to ensure a sufficiently parallel beam profile. The diaphragms define the detectable solid angle. In addition, the source, diaphragms, multilayer mirrors and detectors must be arranged on an axis.

Multilayer systems can also be used in transmission for spectral filtering. As in the reflection case, a narrow-band maximum can also be generated at 13.5 nm in transmission. While transmission is lower compared to the reflection of conventional multilayer systems, it is nevertheless adequate for applications with a sufficiently high radiation flow. The advantage results from the very simple construction of measuring devices because the transmission layer can be arranged directly on an EUV-sensitive detector (U.S. Pat. No. 6,710,351 B2).

However, the restrictions with respect to the incident angle region of the radiation are similar to those in the reflection case. These restrictions play only a subordinate role in spectral filtering by means of transmission layers which are based on the absorption characteristics of the elements or their connections. While the transmission changes with the incident angle of the radiation due to the changing effective layer thickness, this effect is minor in the case of near vertical incidence which is the relevant case in practice. More importantly, there is almost no spectral shift of the transmission as a function of the incident angle, which is not the case with multilayer mirrors. However, there are difficulties involved in realizing a sufficiently narrow transmission window.

OBJECT AND SUMMARY OF THE INVENTION

Therefore, it is the primary object of the invention to solve this problem and to provide a simply constructed reception system which is suitable for characterizing EUV radiation in a narrowly defined spectral region and which automatically detects the wavelength region to be characterized.

According to the invention, this object is met by a narrow-band transmission filter for EUV radiation which comprises a transmission layer system having at least one uranium-containing layer.

Particularly useful and advantageous constructions and further developments of the transmission filter according to the invention are indicated in the dependent claims.

The transmission layer system can have at least one additional layer containing at least one element which suppresses the transmission window of the uranium outside a wavelength region from 13.365 nm to 13.635 nm.

Suitable additional layers are, e.g., silicon, ruthenium and/or molybdenum. In a constructional variant of the invention, the transmission layer system comprises a silicon layer with a thickness in the range from 280 nm to 520 nm, a uranium layer with a thickness in the range from 100 nm to 200 nm, and a ruthenium layer with a thickness in the range from 70 nm to 130 nm.

In a particularly advantageous manner, at least one layer of fluorescing material which emits fluorescent radiation in the visible spectral region when irradiated with transmitted EUV radiation is arranged on the transmission layer system. The fact that the fluorescent radiation is generated from the wavelength to be characterized ensures measurements of absolute radiation flows.

The layer which emits the fluorescent radiation can comprise self-supporting fluorescing material. But the transmission layer system and the layer of fluorescing material can also be arranged on a carrier which is transparent for the visible spectral region.

By means of the transmission layer system according to the invention, a reception device for characterizing EUV radiation can be provided in that the transmission layer system which is formed, e.g., as a foil is arranged on the beam inlet side of a radiation detector.

Alternatively, the transmission layer system can also be arranged directly on the active surface of the radiation detector.

EUV-sensitive photodiodes and EUV-sensitive CCD arrays are particularly suitable as radiation detectors.

The reception device for characterizing EUV radiation can also be constructed in such a way that a receiver, e.g., a camera, particularly a digital camera, working in the visible spectral region is arranged downstream of the transmission layer system on which at least one layer of fluorescing material is arranged.

Accordingly, the invention provides a reception device for characterizing EUV radiation which uses purely transmission without changing the beam direction for spectral filtering.

The invention will be described in more detail in the following with reference to the schematic drawings.

DESCRIPTION OF THE PREFERRED EMBODIMENTS

Figure 1:
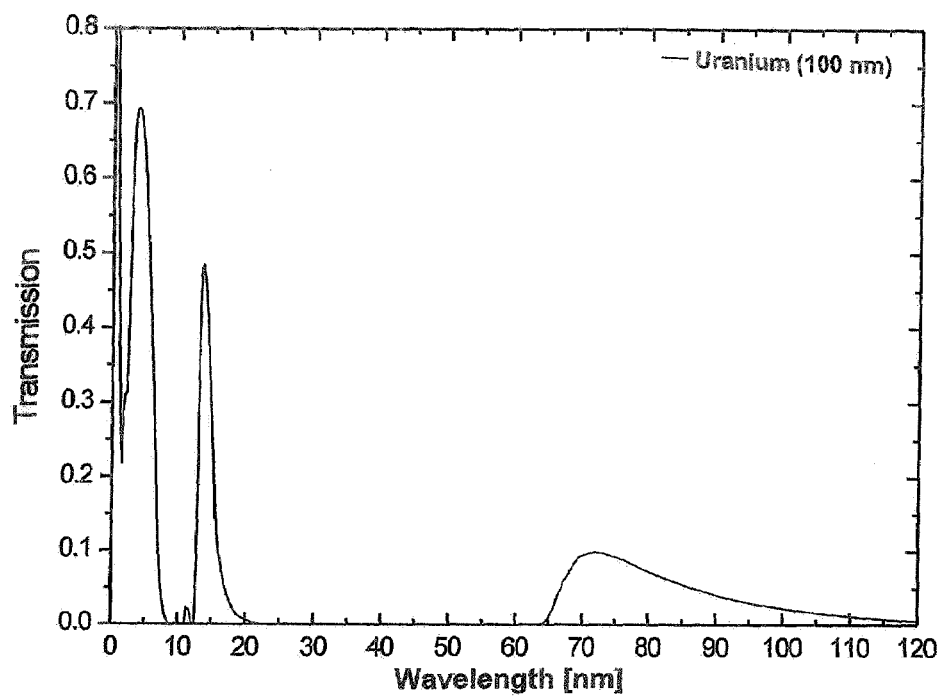
FIG. 1 shows the transmission of a uranium layer with a thickness of 100 nm in the wavelength region from 0.5 nm to 120 mm (a) and from 5 nm to 20 μm (b)
Figure 1:
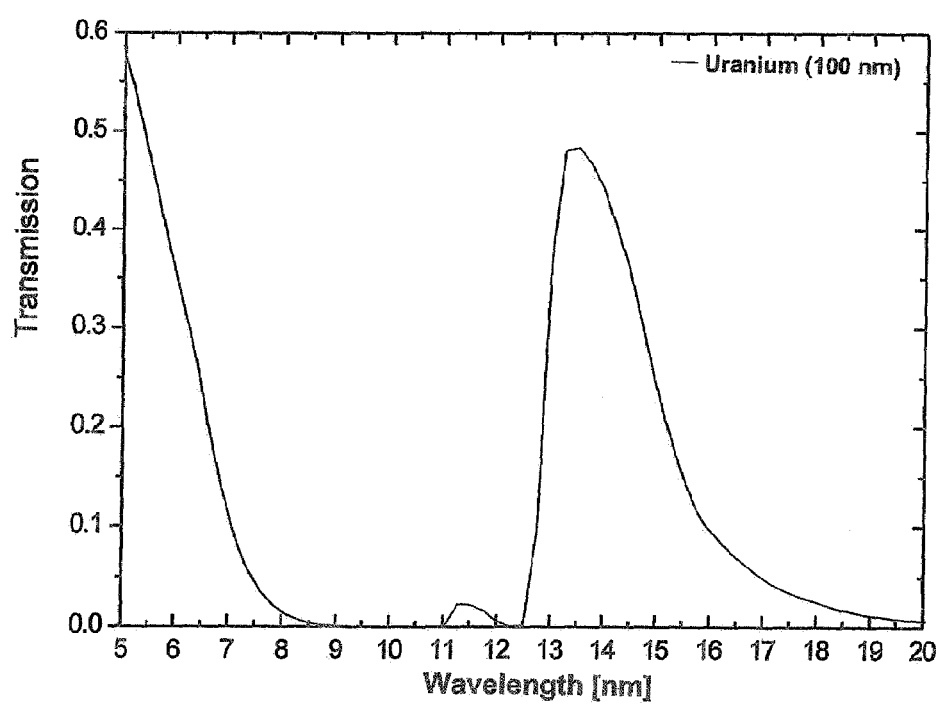
Figure 2:
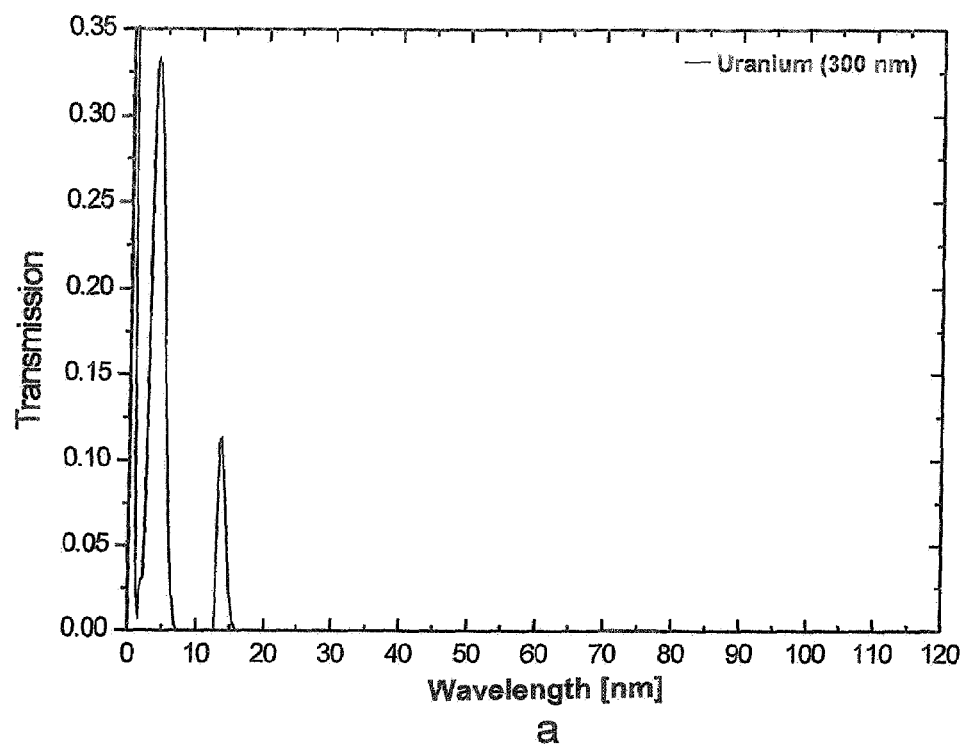
FIG. 2 shows the transmission of a uranium layer with a thickness of 300 nm in the wavelength region from 0.5 nm to 120 nm (a) and from 5 nm to 20 nm (b)
Figure 2:
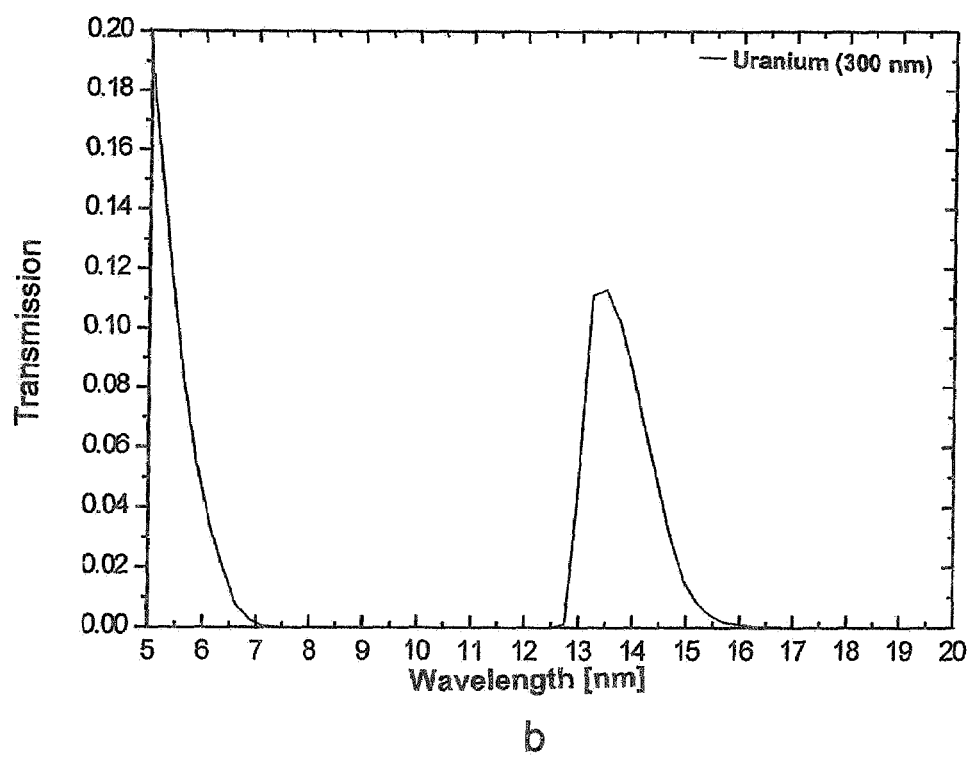

According to FIG. 1, uranium, in this instance a uranium layer with a thickness of 100 nm, exhibits outstanding characteristics for spectral filtering of EUV in-band radiation in transmission, since the transmission rises sharply on the long-wave side of the absorption edge. Uranium shows additional characteristic transmission windows besides the range from 13 nm to 16 nm. Depending on the emission spectrum of the EUV source to be characterized, these characteristic transmission windows can have a very disruptive effect and must be sufficiently suppressed. Increasing the layer thickness suppresses relatively all regions whose transmission is absolutely smaller and strengthens relatively those with greater transmission. In addition, increasing the layer thickness leads to narrower-spectrum transmission windows. Naturally, the absolute transmission decreases appreciably. These effects are illustrated in FIG. 2 which shows the transmission of a uranium layer with a thickness of 300 nm in the wavelength regions from 0.5 nm to 120 nm and from 5 nm to 20 nm.

Depending on the emission spectrum of the EUV source to be characterized, it may be advantageous to combine uranium layers with transmission layers of other elements.

In particular, the transmission ranges shown in FIG. 1 for pure uranium for wavelengths of less than 9 nm, between 11 nm and 12 nm, between 65 nm and 110 nm, and the long-wave side of the desired transmission window from 12.5 nm to 20 nm must be suppressed for the purpose of a narrow-band spectral filtering of the EUV in-band region from 13.365 nm to 13.635 nm.

Figure 3:
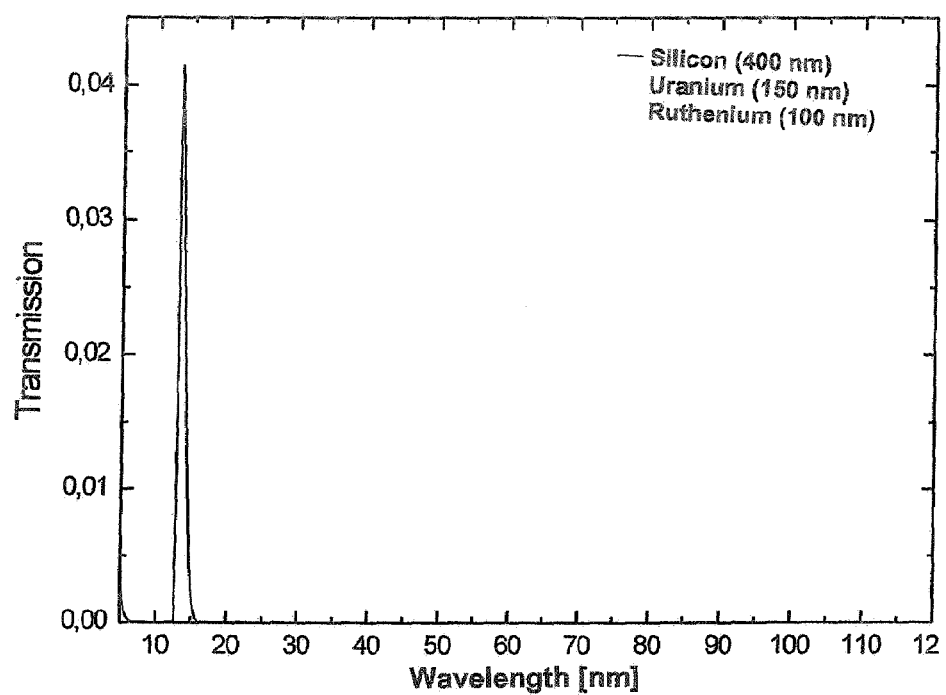
FIG. 3 shows the transmission of a layer system comprising a uranium layer, a silicon layer and a ruthenium layer in the wavelength region from 0.5 nm to 120 nm (a) and from 5 nm to 20 nm (b)
Figure 3:
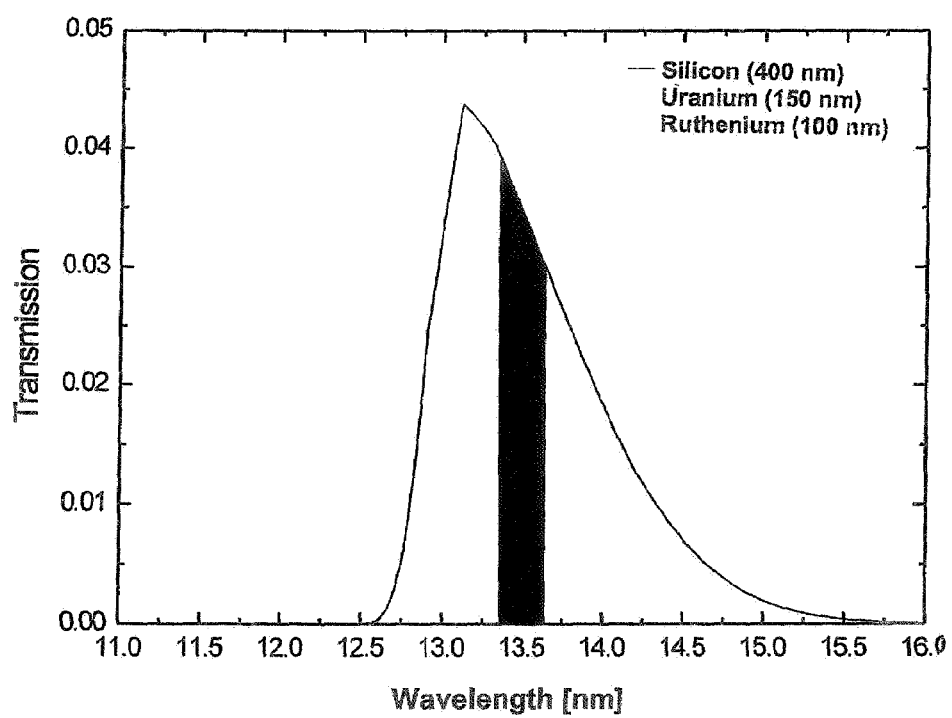

FIG. 3 shows a particularly advantageous transmission layer system in which a uranium layer with a thickness of 150 nm is combined with a silicon layer with a thickness of 400 nm and a ruthenium layer with a thickness of 150 nm. Aside from the desired transmission windows at a wavelength λ of 13.5 nm, no regions with significant transmission are shown. The in-band region from 13.365 nm to 13.635 nm is shown by a highlighted area (b). Aside from ruthenium, other elements such as molybdenum are also suitable as additional layers.

In another construction, not shown, the transmission layer system (6) can also comprise a silicon layer with a thickness in the range from 280 nm to 520 nm, a uranium layer with a thickness in the range from 100 nm to 200 nm, and a ruthenium layer with a thickness in the range from 70 nm to 130 nm.

Since the sequence of layers for transmission is unimportant, it is possible to protect elements or connections which are less stable chemically from damaging environmental influences (e.g., oxidation) by coating them with more stable elements.

According to the invention, the uranium-containing layers in a beam profile 1 being examined which radiates in a broad spectral band can be arranged in front of an EUV-sensitive radiation detector 2 to obtain a suitable reception device for characterizing radiation in a narrowly defined EUV wavelength region.

Figure 4:
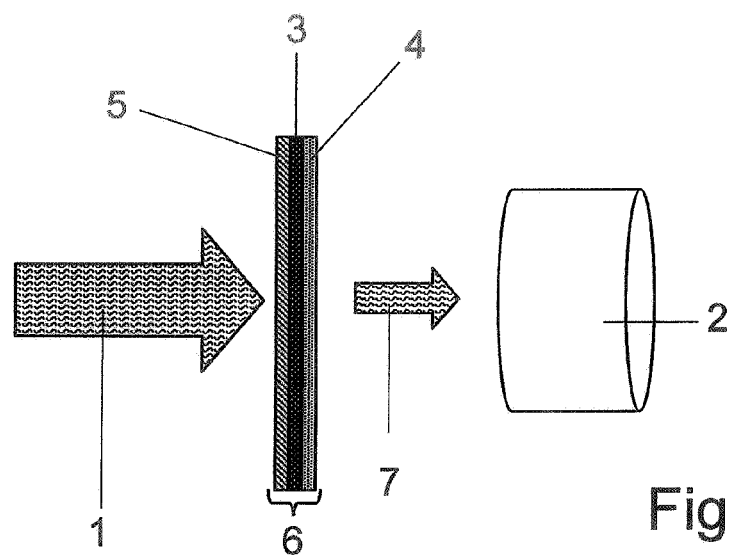
FIG. 4 shows a reception device comprising a foil-like transmission filter and a radiation detector which is sensitive to EUV radiation.

In an advantageous construction according to FIG. 4, a foil-like transmission layer system 6 comprising a combination of a uranium-containing layer 3, a layer 4 of silicon and a layer 5 of ruthenium is arranged in front of the radiation detector 2.

Figure 5:
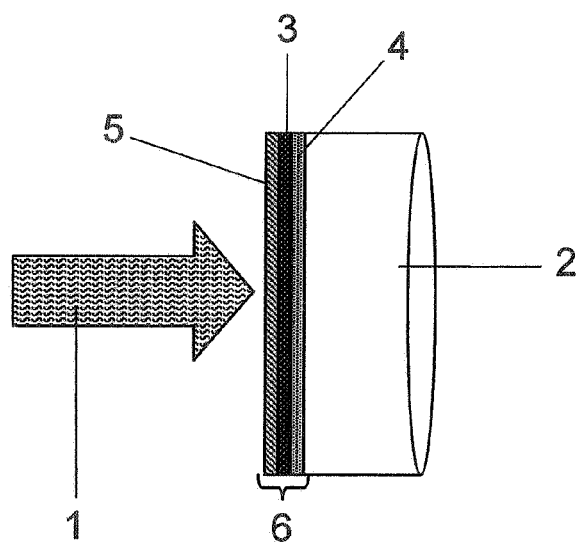
FIG. 5 shows a reception device with a radiation detector which is sensitive to EUV radiation and on which a transmission layer system according to the invention is arranged.

According to FIG. 5, it is also possible to coat the active surface of the radiation detector 2 directly, which leads to an appreciable increase in mechanical stability because the layers 3, 4 and 5 are arranged on an immovable substrate.

In other constructions of the invention, transmitted EUV radiation 7 is transformed into visible radiation and is detected with a receiver 2' which is sensitive to the VIS range.

This can be carried out in that at least one layer 11 of fluorescing material is arranged on the transmission layer system which emits fluorescent radiation 8 in the visible spectral region when irradiated by the transmitted EUV radiation 7.

Figure 6:
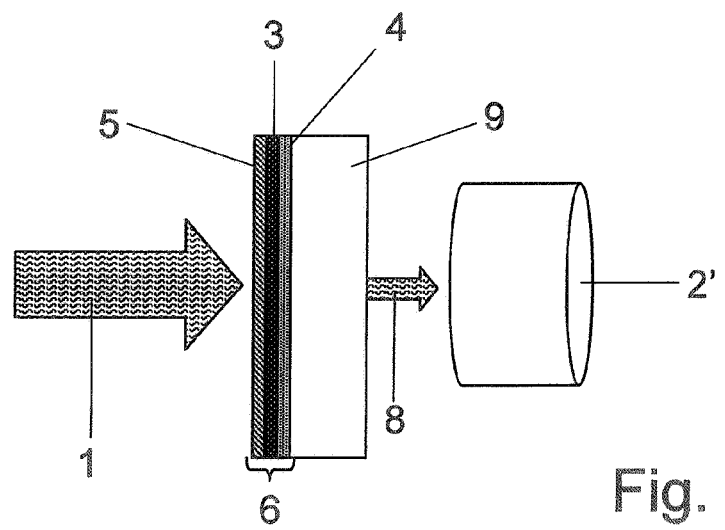
FIG. 6 shows a reception device comprising a receiver which is sensitive to VIS radiation and a self-supporting fluorescing material which is coated with a transmission layer system according to the invention.

When, e.g., a CE:YAG crystal is used as fluorescing material, it can serve as a carrier 9 which is coated with layers 3, 4 and 5 (FIG. 6).

Figure 7:
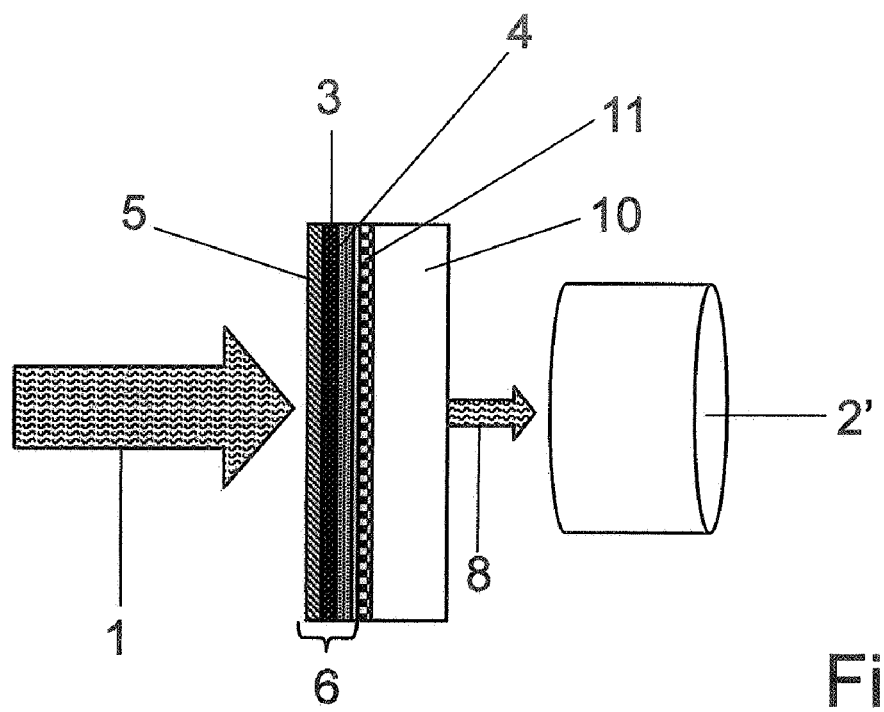
FIG. 7 shows a reception device comprising a receiver which is sensitive to VIS radiation and a carrier which is transparent for VIS radiation and with a transmission layer system according to the invention and a layer of fluorescing material arranged thereon.

When the fluorescing material is not self-supporting, e.g., P43, a carrier 10 which is transparent for the visible spectral region can be used according to FIG. 7 for layers 3, 4, 5 and the layer 11 of fluorescing material.

Figure 8:
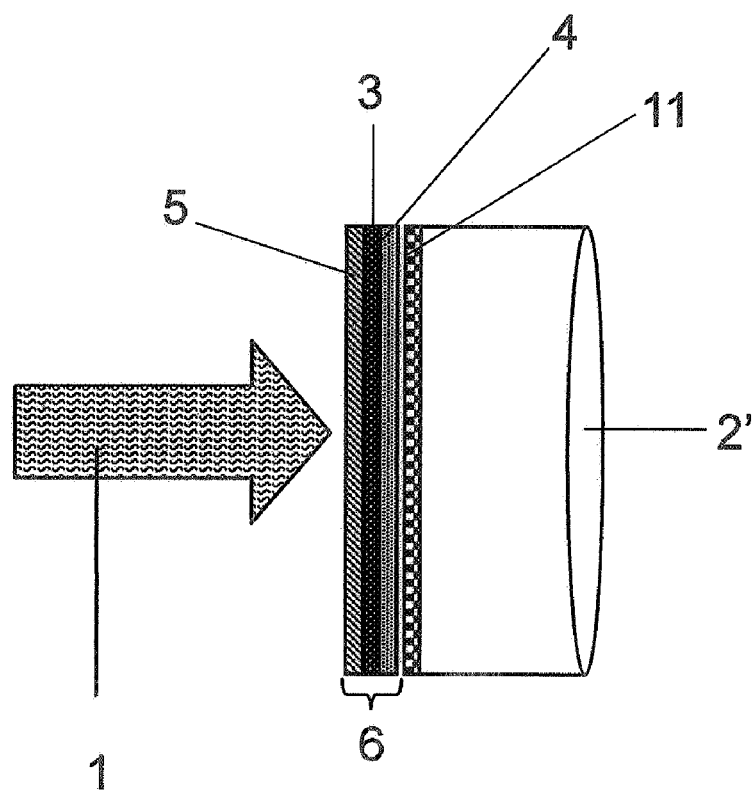
FIG. 8 shows a reception device comprising a receiver which is sensitive to VIS radiation and a coating comprising a transmission layer system according to the invention and a layer of fluorescing material.

Finally, it is possible to use the receiver itself as a carrier in that the layers 3, 4, 5 and the fluorescing material are arranged directly on the receiver 2' (FIG. 8).

Suitable detectors are, e.g., photodiodes, CCDs and fluorescent screens. However, the combination of the transmission layer system with spatially resolving detectors such as CCD arrays or fluorescent screens which permit a spatial characterization of EUV beam profiles are particularly advantageous.

While the foregoing description and drawings represent the present invention, it will be obvious to those skilled in the art that various changes may be made therein without departing from the true spirit and scope of the present invention.

What is claimed is:

1. A narrow-band transmission filter for EUV radiation comprising a transmission layer system having at least one uranium-containing layer and at least one additional layer containing at least one element which suppresses the transmission window of the uranium outside a region from 13.365 nm to 13.635 nm.

2. The transmission filter according to claim 1, wherein one of the additional layers contains silicon.

3. The transmission filter according to claim 1, wherein one of the additional layers contains ruthenium.

4. The transmission filter according to claim 1, wherein the transmission layer system comprises a silicon layer with a thickness in the range from 280 nm to 520 nm, a uranium layer with a thickness in the range from 100 nm to 200 nm, and a ruthenium layer with a thickness in the range from 70 nm to 130 nm.

5. The transmission filter according to claim 1, wherein at least one layer of fluorescing material which emits fluorescent radiation in the visible spectral region when irradiated with transmitted EUV radiation is arranged on the transmission layer system.

6. The transmission filter according to claim 5, wherein the layer which emits fluorescent radiation comprises self-supporting fluorescing material.

7. The transmission filter according to claim 5, wherein the transmission layer system and the layer of fluorescing material are arranged on a carrier which is transparent for the visible spectral region.

8. The reception device for characterizing EUV radiation in which a receiver working in the visible spectral region is arranged downstream of a transmission filter according to claim 5.

9. The reception device according to claim 8, wherein the receiver working in the visible spectral region is a camera.

10. The reception device according to claim 8, wherein the camera is constructed as a digital camera.

11. A reception device for characterizing EUV radiation in which a transmission layer system according to claim 1 is arranged on the beam inlet side of a radiation detector.

12. The reception device according to claim 11, wherein the transmission layer system is constructed as a foil.

13. The reception device according to claim 11, wherein the transmission layer system is arranged on the active surface of the radiation detector.

14. The reception device according to claim 11, wherein the radiation detector is an EUV-sensitive photodiode.

15. The reception device according to claim 11, wherein the radiation detector is an EUV-sensitive CCD array.

* * * * *